United States Patent [19]

Still et al.

[11] Patent Number: 4,525,714
[45] Date of Patent: Jun. 25, 1985

[54] PROGRAMMABLE LOGIC ARRAY WITH TEST CAPABILITY IN THE UNPROGRAMMED STATE

[75] Inventors: David W. Still, Phoenix; Peter C. Economopoulos, Scottsdale, both of Ariz.

[73] Assignee: Honeywell Information Systems Inc., Phoenix, Ariz.

[21] Appl. No.: 446,816

[22] Filed: Dec. 3, 1982

[51] Int. Cl.$^3$ ............................................. H04Q 00/00
[52] U.S. Cl. .......................... 340/825.83; 340/825.85; 29/574; 307/465; 365/96
[58] Field of Search ...................... 340/825.79, 825.83, 340/825.85; 29/574; 307/465; 365/96

[56] References Cited

U.S. PATENT DOCUMENTS 3,940,740  2/1976  Coontz ............................ 340/825.84
4,207,556  6/1980  Sugiyama et al. ............. 340/825.84
4,329,685  5/1982  Mahon et al. ................... 340/825.84

OTHER PUBLICATIONS

Fujiwara et al., "A Design of Programmable Logic Arrays with Universal Tests", IEEE Transactions on Computers, Nov. 1981.
Daehn et al., "A Hardware Approach to Self-Testing of Large Programmable Logic Arrays", IEEE Transactions on Computer, Nov. 1981.
"The Effect of Untestable Faults in PLAs and a Design for Testability", IEEE Test Conference, Nov. 1980.

Primary Examiner—Ulysses Weldon
Attorney, Agent, or Firm—A. A. Sapelli; J. S. Solakian; L. J. Marhoefer

[57] ABSTRACT

A programmable circuit array comprises an input buffer adapted to receive a plurality of input signals for outputting equivalent input signals and inverted input signals. A programmable product array receives the equivalent input signals and the inverted input signals, for generating a plurality of logical product terms. A programmable sum array combines the plurality of product terms to generate a plurality of sum terms, each of the plurality of sum terms being an output of the programmable circuit array. Test logic is included which selectively causes each of the product terms, the equivalent input signals, and the inverted input signals to have a predetermined logic state in response to at least one control signal.

7 Claims, 6 Drawing Figures

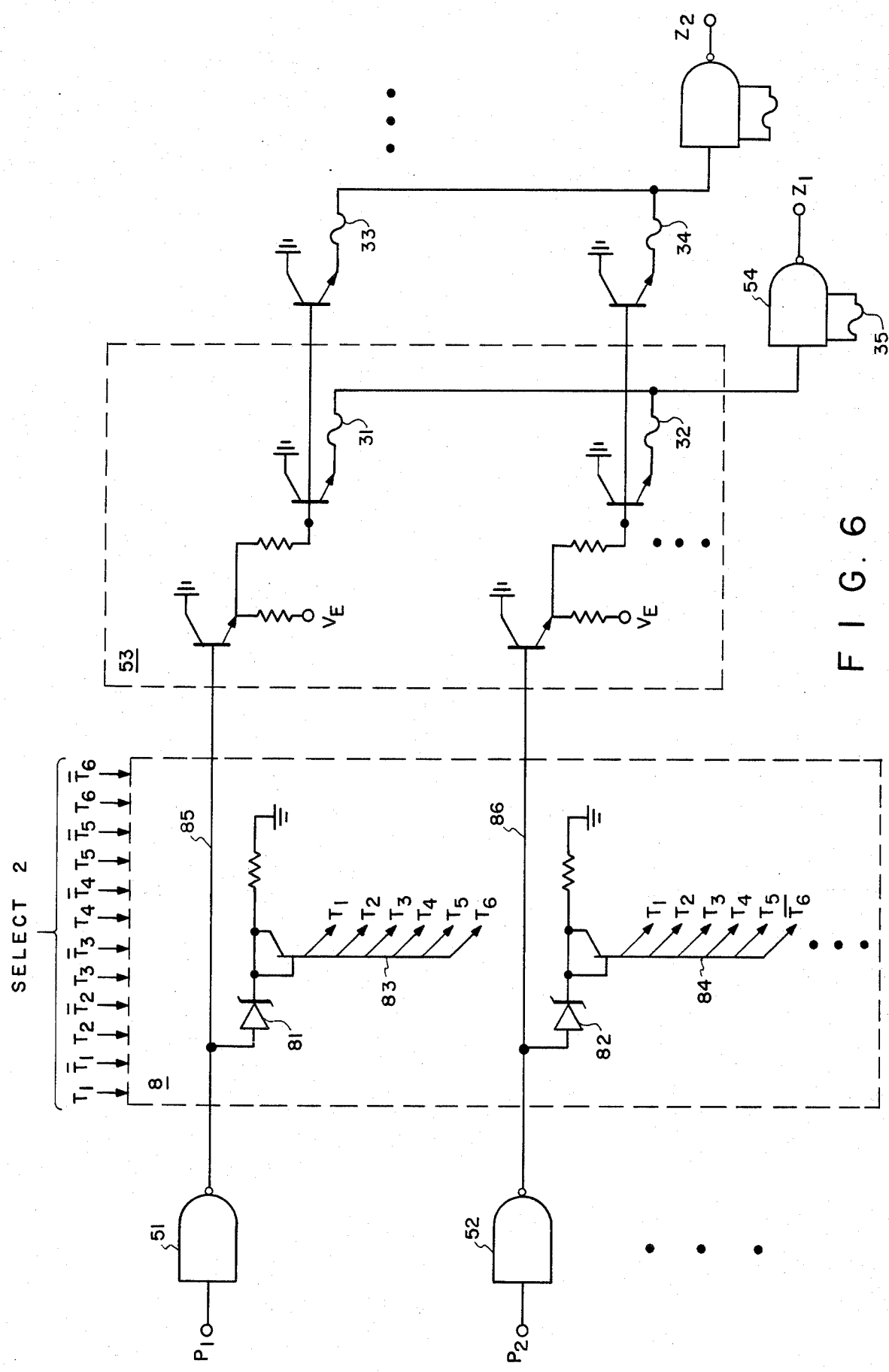
F I G. 6

PROGRAMMABLE LOGIC ARRAY WITH TEST CAPABILITY IN THE UNPROGRAMMED STATE

BACKGROUND OF THE INVENTION

This invention relates to a logic circuit, and more particularly to the testability of a programmable logic array.

In the design of logic circuits, programmable logic arrays (PLA) have become increasingly more important for designing combinational logic circuits. These programmable logic arrays offer a greater variety and flexibility in logic design while lowering parts count and inventory requirements, and are also proving to be very cost effective. With programmable logic devices, a designer can customize a reliable, high volume integrated circuit to fit a specific application, and quickly.

However, until recently, little has been done to test the programmable logic array in the unprogrammed state. This is due in part to the unavailability of an adequate number of test points on the chip. The various testing techniques devised require augmenting the PLA with a substantially large amount of additional logic which can interfere with the normal operation of the PLA logic or which requires and dissipates additional power even while the PLA is operating normally.

The present invention presents a novel approach for providing test capability of a programmable logic array in the unprogrammed state with some small amount of added logic which is inoperative and dissipates no added power while the PLA is operating in its normal environment.

SUMMARY OF THE INVENTION

Therefore, there is supplied a programmable circuit array, having a plurality of input terminals adapted to receive a plurality of input signals. The programmable circuit array comprises a programmable product array element which is operatively connected to the input terminals for generating a plurality of logical product terms. A programmable sum array element is included for combining the plurality of product terms to generate a plurality of sum terms, each of the plurality of sum terms being an output of the programmable circuit array. Test logic is also included which selectively causes each of the product terms to have a predetermined logic state in response to at least one control signal.

The product array element includes a plurality of AND gates, each AND gate coupled to receive a respective input signal, and each AND gate having associated therewith a fusible link. The sum array element includes a plurality of OR gates, each OR gate coupled to receive a respective product term, and each input of each OR gate having associated therewith a fusible link. An input buffer can also be included to provide the input signal and the complement of the input signal to the product array element. The output can include a plurality of exclusive-OR elements each exclusive-OR element coupled to a respective output, and each exclusive-OR element having a fusible link, thereby providing a programmable capability to the output signal whereby the output can be in a normal or inverted state.

Accordingly, it is an object of the present invention to provide a programmable logic array having test capability.

It is another object of the present invention to provide a programmable logic array having one hundred percent test capability.

It is still another object of the present invention to provide a programmable logic device having one hundred percent test capability for detecting stuck-at faults occurring at all the gate inputs of the programmable logic array chip.

These and other objects of the present invention will become more apparent when taken in conjunction with the following description and attached drawings, wherein like characters indicate like parts, and which drawings form a part of the present application.

BRIEF DESCRIPTION OF THE DRAWINGS

FIG. 6 shows the circuit diagram of a sum array and a selector of the preferred embodiment of the present invention.

DETAILED DESCRIPTION

Figure 1:
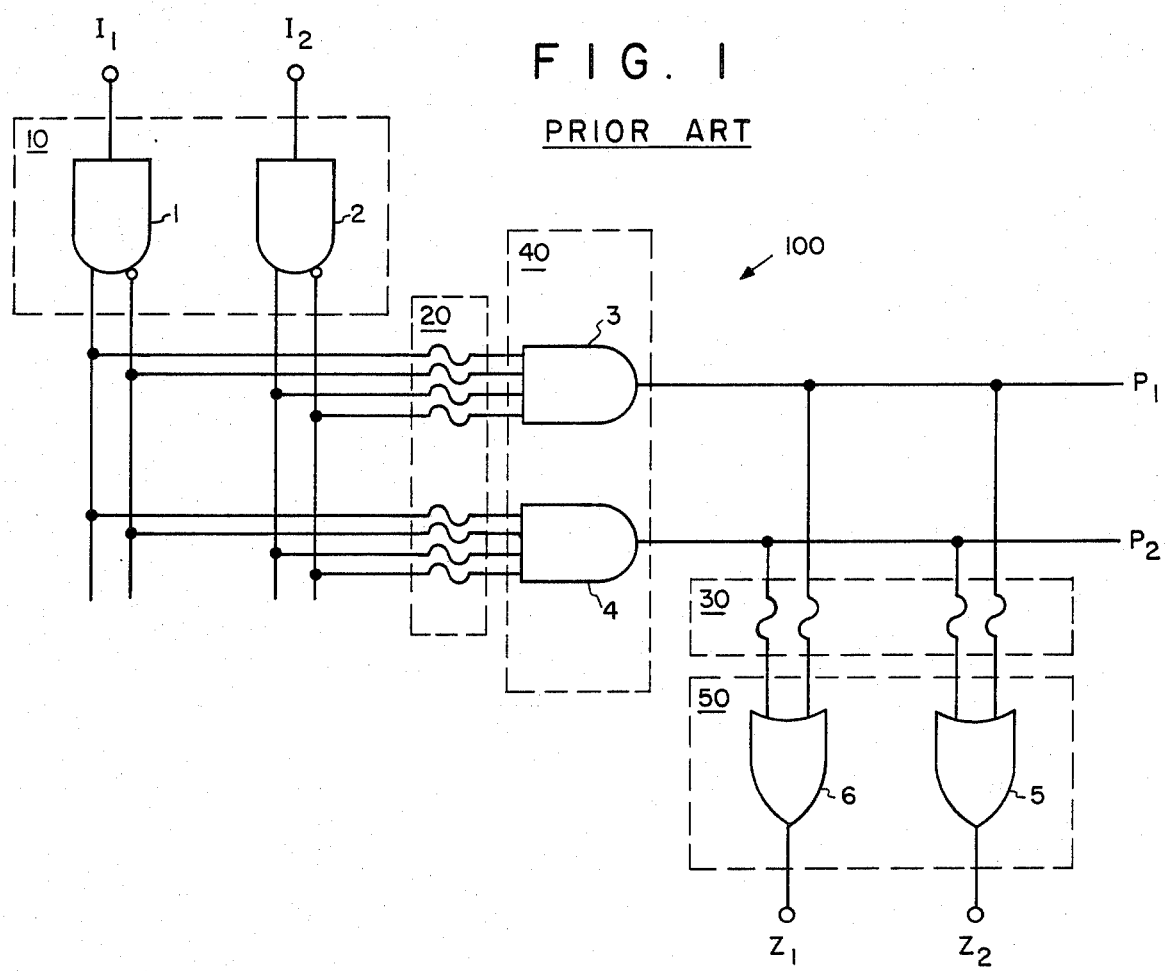
FIG. 1 shows a block diagram of a programmable logic array of the prior art.

Referring to FIG. 1, there is shown a programmable logic array (PLA) 100 of the prior art containing an input block 10 providing input terminals for receiving input signals $I_1$, $I_2$, operatively connected to a first fusible links network 20 of a product (AND) array 40, which in turn outputs product terms $P_1$ and $P_2$. The product terms are operatively connected through a second fusible links network 30 of a sum (OR) array 50 providing outputs $Z_1$, $Z_2$. The input block 10 comprises input buffers 1, 2 each having an output and an inverted (or complement) output, the inverted output having the circle denoting the inversion function. The product array 40 comprises two, four-input AND gates 3, 4, each input of each AND gate 3, 4 having a fusible link connected to each input of the AND gates 3, 4, the fusible links forming the first fusible link network 20. Each input of each AND gate 3, 4 is operatively connected to a respective output of input block 10. The sum array 50 comprises two OR gates 5, 6, each OR gate 5, 6 having two inputs each of which is operatively connected to a respective product P1, P2. Each input of each OR gate has associated therewith a fusible link, these fusible links comprising a second fusible links network 30. The PLA 100 can be programmed by vaporizing (i.e., the fusible link is electrically opened thereby breaking or opening the circuit) each link as desired to generate the desired logic output terms $Z_1$ and $Z_2$.

Prior to programming PLA 100 it is desirable to test the PLA 100 in the unprogrammed state. (Programming a PLA 100 may also be denoted herein by the terms customizing or personalizing a PLA.) Since the inputs to AND gate 3 will include the terms $I_1$ and $\overline{I_1}$, and since $I_1 \cdot \overline{I_1} = 0$, AND gate 3 can never be fully tested.

Figure 2:
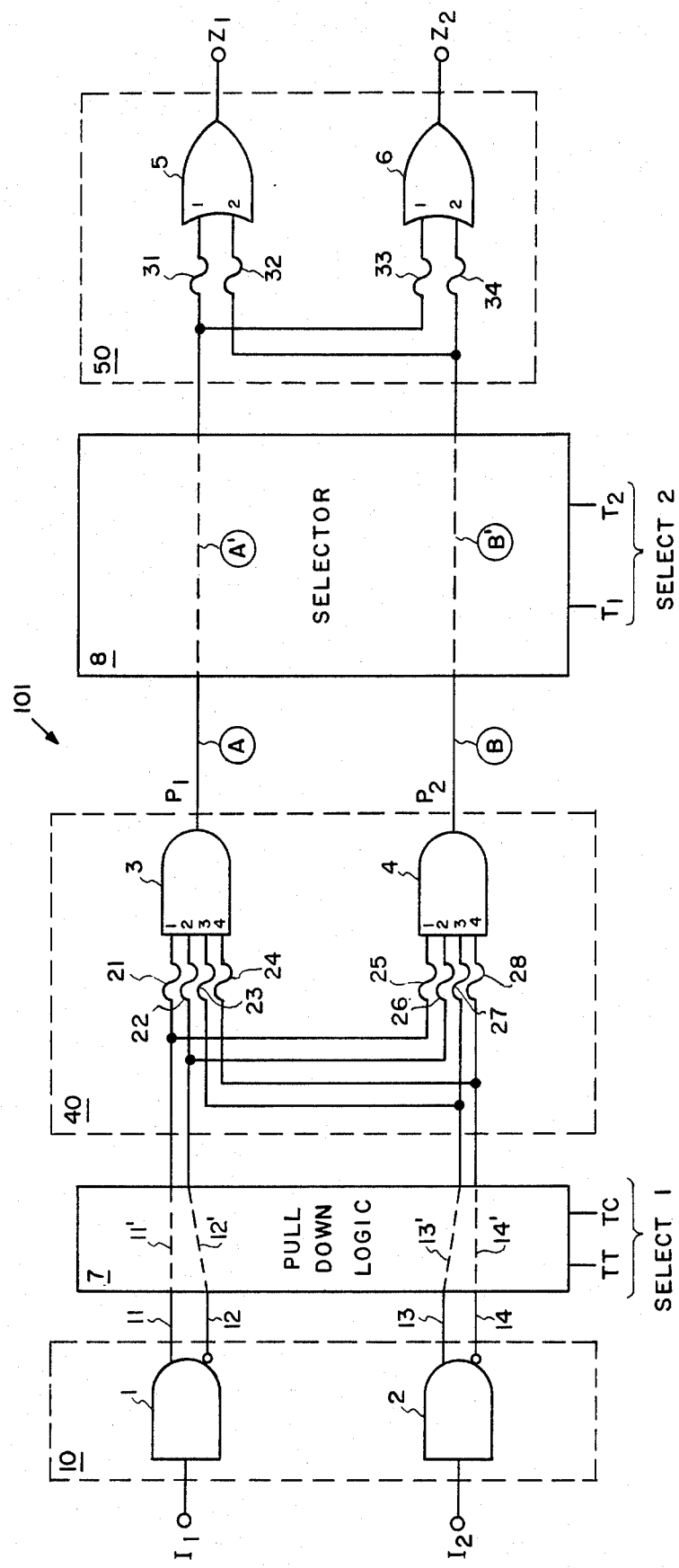
FIG. 2 shows a functional logic diagram of a programmable logic array of the present invention.

Referring to FIG. 2, there is shown a functional logic drawing of a PLA 101 of the present invention which includes test logic for providing test capability which tests the PLA 101 in the unprogrammed state. The PLA 101 of the present invention includes input buffers 1, 2 operatively connected to two four-input AND gates 3, 4 through fusible links 21-28, the inputs to each AND gate denoted 1-4, and each AND gate outputs respective product terms $P_1$, $P_2$ (also denoted as A, B.) Each product term is operatively connected to two-input OR gates 5, 6 through respective fusible links 31-34, the inputs to each OR gate denoted 1, 2, and each OR gate outputs respective output terms $Z_1$, $Z_2$.

Testing of PLA 101 in the unprogrammed state is performed by setting predetermined select 1 control signals TT and TC and predetermined select 2 control signals $T_1$ and $T_2$, varying the input signals, $I_1$ and $I_2$, to input buffer 1, 2 to various combinations of logic 1 and logic 0, and verifying output signals $Z_1$ and $Z_2$ for each combination of input signal $I_1$ and $I_2$. By setting select 1 control signal TT to a logic zero and TC to a logic one, pull down logic 7 operates to force input gate 1,2 complement outputs 12' and 14' to a logic one. By setting control signals $T_1$ and $T_2$ to a logic 1 and logic 0 respectively, selector 8 causes line B' to have a predetermined logic state, i.e., a logic 0, while line A' operates normally, i.e., the signal on line A' follows the signal on line A, which is the product signal $P_1$.

The testing procedure will now be described in conjunction with FIG. 2 and Table 1. Step 1 of the test procedure sets input signals $I_1$ and $I_2$ to a logic 1. The outputs of input buffer 1 are respectively a logic 1 and logic 0 on lines 11 and 12, respectively. The output signal of input buffer 2 is a logic 1 and logic 0 on lines 13 and 14, respectively. Because the pulldown logic 7 forces the complement output 12' and 14' to a logic 1 all four outputs 11' through 14' of pulldown logic 7 are all at logic 1. Since all four inputs to the AND gates 3, 4 are logic ones, the outputs of AND gates 3, 4 (A, B) are both at logic one. The A' output of selector 8 will be a logic 1, since control signal $T_1$ has been set to a logic 1 thereby allowing the signal on line A' to follow the signal on line A. Since control signal $T_2$ has been set to a logic zero, the B' output of selector 8 is forced to a logic zero. Hence, the one input of OR gates 5, 6 will have a logic 1 and the two input of OR gates 5, 6 will have a logic 0. Since one input of the OR gate is conditioned (the one input of both OR gates 5, 6 have a logic one), the $Z_1$ and $Z_2$ outputs will both be a logic 1. The logic levels thus described are in accordance with step 1 of Table 1.

TABLE 1

| Step | $I_1$ | $I_2$ | TT | TC | A | B | $T_1$ | $T_2$ | A' | B' | $Z_1$ | $Z_2$ |
|---|---|---|---|---|---|---|---|---|---|---|---|---|
| 1 | 1 | 1 | 0 | 1 | 1 | 1 | 1 | 0 | 1 | 0 | 1 | 1 |
| 2 | 0 | 1 | 0 | 1 | 0 | 0 | 1 | 0 | 0 | 0 | 0 | 0 |
| 3 | 1 | 0 | 0 | 1 | 0 | 0 | 1 | 0 | 0 | 0 | 0 | 0 |
| 4 | 0 | 0 | 1 | 0 | 1 | 1 | 1 | 0 | 1 | 0 | 1 | 1 |
| 5 | 1 | 0 | 1 | 0 | 0 | 0 | 1 | 0 | 0 | 0 | 0 | 0 |
| 6 | 0 | 1 | 1 | 0 | 0 | 0 | 1 | 0 | 0 | 0 | 0 | 0 |
| 7 | 1 | 1 | 0 | 1 | 1 | 1 | 0 | 1 | 0 | 1 | 1 | 1 |
| 8 | 0 | 1 | 0 | 1 | 0 | 0 | 0 | 1 | 0 | 0 | 0 | 0 |
| 9 | 1 | 0 | 0 | 1 | 0 | 0 | 0 | 1 | 0 | 0 | 0 | 0 |
| 10 | 0 | 0 | 1 | 0 | 1 | 1 | 0 | 1 | 0 | 1 | 1 | 1 |
| 11 | 1 | 0 | 1 | 0 | 0 | 0 | 0 | 1 | 0 | 0 | 0 | 0 |
| 12 | 0 | 1 | 1 | 0 | 0 | 0 | 0 | 1 | 0 | 0 | 0 | 0 |

Steps 2 and 3 vary the input signals $I_1$ and $I_2$ verifying the one input of OR gates 5, 6, and verifying the 1 and 4 input of AND gate 3, respectively. Step 1 and Step 4 also check the true output and complement output of input buffer 1, 2 respectively. Steps 4, 5 and 6 reverse the select 1 control signals thereby forcing the true output of input buffer 1, 2 to a logic 1, namely 11' and 13' are forced to a logic 1. This permits steps 5 and 6 to verify the proper functioning of the 2 and 3 input of AND gate 3. Steps 7-12 essentially repeat steps 1-6 above but the select 2 control signals, $T_1$ and $T_2$, are reversed. In this case, selector 8 forces line A' to a logic 0 and allows the signal on line B' to follow the input signal B, thereby verifying the functioning of the 2 input of OR gates 5,6. In addition, steps 8, 9, 11, 12 verify the proper functioning of inputs 1, 4, 2, and 3 of AND gate 4, respectively.

Figure 3:
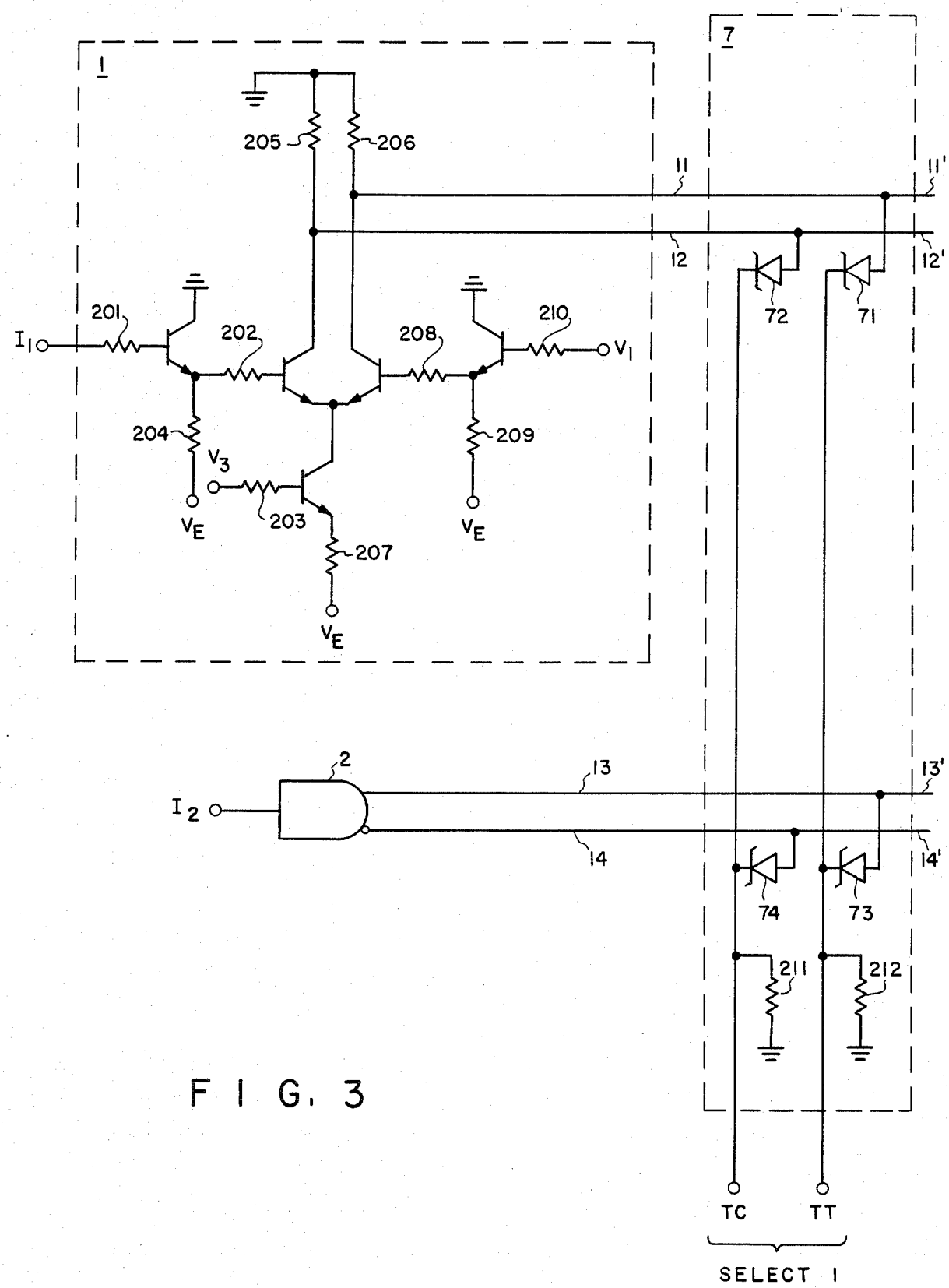
FIG. 3 shows a circuit diagram of an input buffer and pull up logic of the preferred embodiment of the present invention.

The circuit of the input buffer 1, 2 of the preferred embodiment of the present invention shown in FIG. 3. The PLA 101 of the preferred embodiment of the present invention is implemented in current mode logic (CML) technology. Negative logic is utilized in PLA 101. In the preferred embodiment, a logic 0 is 0 volts and a logic 1 is $-0.5$ volts or $-500$ millivolts ($-0.5$ V or $-500$ MV). Typical component values are as follows:

resistors 201, 202, 203—50 ohms
resistor 204—10,000 ohms
resistors 205, 206—560 ohms
resistor 207—270 ohms
resistor 208—50 ohms
resistor 209—10,000 ohms
resistor 210—50 ohms
resistors 211, 212—2,000 ohms
$V_e$—3.3 volts
$V_1$—0.26 volts
$V_3$—2.25 volts Also shown in FIG. 3 is the circuit diagram of pullup logic 7. The true output lines 11, 13 of input buffer 1, 2 are tied through diodes 71, 73 to the TT select 1 control line. Similarly, the complement output 12, 14 of input gates 1, 2 are each tied through diodes 72, 74, to TC control line of select 1 control signal. The control signals TT, TC operate to pull down the respective line to a logic 1. The TT, TC control signal operate such that the line varies between 0 volts and $-1$ volts, 0 volts corresponding to a logic zero and a $-1$ volt corresponding to a logic 1.

Figure 4:
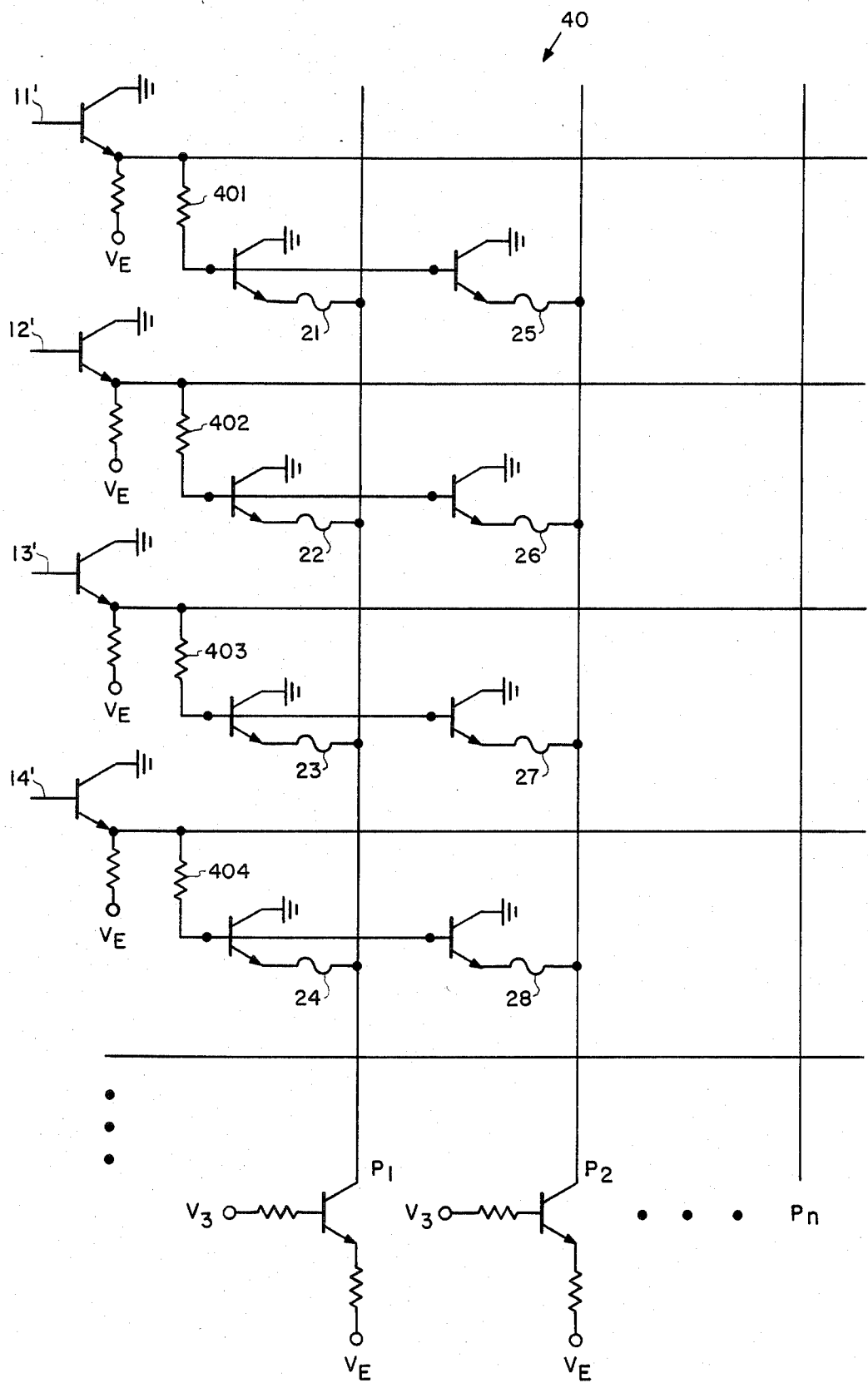
FIG. 4 shows a circuit diagram of a product array of the preferred embodiment of the present invention.

The circuit diagram of the product array 40 is shown in FIG. 4. Resistors 401-404 are typically 100 ohms. The fusible links 21-28 are shown and correspond to the fusible links of FIG. 2. Still referring to FIG. 4, the product terms $P_1$ and $P_2$ are shown as the output of their respective AND gates 3, 4. Although only two input buffers have been shown and discussed thus far, it will be understood by those skilled in the art that more input buffers may be implemented. Two 4-input AND gates have been discussed thus far. It will be appreciated and understood by those skilled in the art that more AND gates may be implemented resulting in an increased number of product terms. The circuit diagram shown in FIG. 4 can be expanded to increase the number of product terms up to $P_n$ by adding a like number of circuits in each vertical column. For additional input buffers additional input lines can be added to increase the number of inputs to each respective AND gate.

The sum array 50 of the preferred embodiment of the present invention is implemented utilizing Boolean equivalent:

$$A + B = \overline{\overline{A} \cdot \overline{B}}$$

Figure 5:
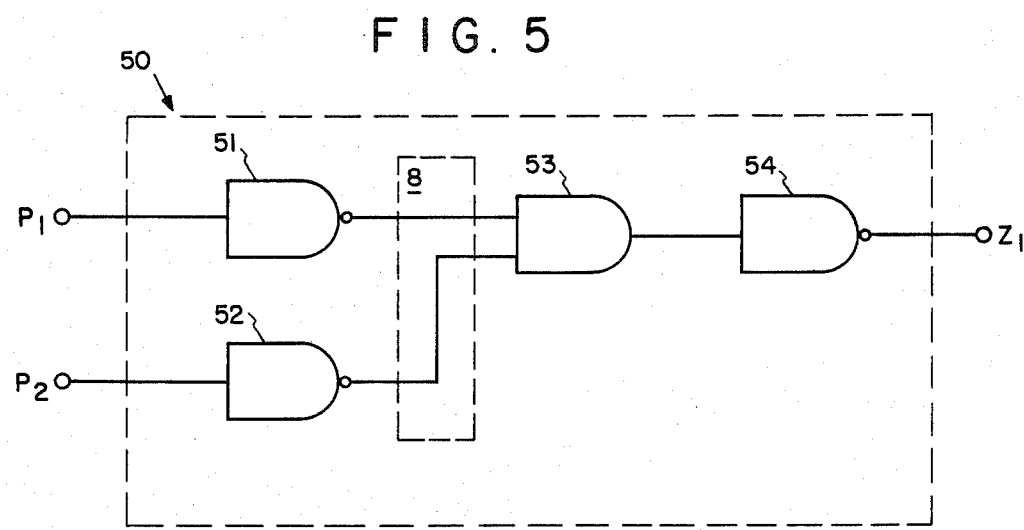
FIG. 5 shows a logic equivalent of the sum gates of the preferred embodiment of the present invention.

Hence, the OR gates 5, 6 are each implemented logically as shown in FIG. 5. Although the selector 8 is functionally placed at the input of the OR gates 5, 6 as shown in FIG. 2, the selector logic 8 is more readily positioned and more easily implemented in CML (current mode logic) as shown in FIG. 5 and will be described in further detail hereinunder.

FIG. 6 shows the circuit diagram of the sum array 50 and the selector 8 which corresponds to FIG. 5. Inverters 51 and 52 receive the product inputs $P_1$ and $P_2$, respectively. Each inverter 51, 52 may be implemented utilizing the circuit diagram of the input buffer 1 utilizing only the complement output. The output of each inverter 51, 52 is operatively coupled to the AND array 53 through selector 8.

Selector 8 comprises a diode 81, 82 coupled to the output of its respective inverter 51, 52. Each diode 81, 82 has coupled thereto a 6-emitter transistor 83, 84 the six emitters of each transistor being selectively coupled to six of the twelve select 2 control signals. The twelve individual select 2 control signals are denoted $T_1$ through $T_6$ and $\overline{T_1}$ through $\overline{T_6}$. Twelve signals are required to select the forty product terms in the preferred embodiment. If any of the select 2 control signals is set to a −2 volts, the input line 85, 86 will be pulled down to a −0.7 volts or a logic 1, which is the functional equivalent of pulling down A' or B' to a logic 0. In the testing process all transistors but one will be pulled down. The emitter connections for transistor 83 are connected to select 2 control signals T1, T2, T3, T4 T5, and T6 and transistor 84 is connected to select 2 control signal $\overline{T_1}$, $\overline{T_2}$, $\overline{T_3}$, $\overline{T_4}$, $\overline{T_5}$, and $\overline{T_6}$. Thus when select control signal T1-T6 are respectively at logic 000000 (and $\overline{T_1}$-$\overline{T_6}$ are therefore at logic 111111), all the emitter connections of transistor 83 will be at a logic 0 (0 volts) thereby enabling line 85. All the other lines, 86, will have at least one emitter connected to a logic 1, or −2 volts thereby holding line 86 to a logic 1 (for example, emitter $\overline{T_6}$ of transistor 84 connected to $\overline{T_6}$ which is a logic 1 or −2 volts.) When $\overline{T_1}$-$\overline{T_6}$ are at logic 000001, transistor 84 will be selected. Thus, only one product turn will be enabled by selector logic 8 as discussed above.

The circuit diagram of AND gate 53 shown in FIG. 6 has a similar configuration to the product array 40 as discussed above. Fusible links 31 and 32 correspond to the fusible links of OR gate 5 of FIG. 2. Likewise, fusible links 33 and 34 correspond to the fusible links of OR gate 6 of FIG. 2. Still referring to FIG. 6, inverter 54 forms part of the sum array 50 as discussed above in connection with Boolean equivalent. Inverter 54 may be an exclusive OR, containing a fusible link 35 to yield the inverted output $Z_1$. Although only two OR gates have been discussed it will be understood by those skilled in the art that a greater number of OR gates 5, 6 may be added.

Twelve OR gates are implemented in the preferred embodiment of the preferred invention resulting in a programmable logic array PLA 101 containing 22 inputs, 12 outputs and 40 P-terms, i.e., 22 input buffers, 40 AND gates, and 12 OR gates. The testing of PLA 101 of the preferred embodiment requires 1,840 steps. The test sequence is shown in Table 2 and 2A. Test No. 1–46 is conducted in accordance with number 1–46, test number 47–92 consists of repeating the test sequence of numbers 1–46 of Table 2 varying the select 2 control inputs as indicated in Table 2A. Test Nos. 93–138, etc. are repeated until 1,840 steps have been completed. This sequence checks the inputs of all the gates of the PLA 101. It will be appreciated by those skilled in the art that the steps may be done manually or may be implemented using automated means, such as computer driven test signals.

While there has been shown what is considered to be the preferred embodiment of the invention, it will be manifest that many changes and modifications can be made therein without departing from the essential spirit and scope of the invention. It is intended, therefore, in the annexed claims, to cover all such changes and modifications which fall within the true scope of the invention.

TABLE 2

| NUM | "0" = 0.0V "1" = −1.2V T T | T C | "0" = 0.0V "1" = −0.5V I1 I1 I1 I1 I1 I1 I1 I1 I1 I1 I1 I1 0 0 0 0 0 0 0 0 0 1 1 1 1 2 3 4 5 6 7 8 9 0 1 2 | Z Z 0 0 1 2 | Z Z 0 0 3 4 | Z Z 0 0 5 6 | Z Z 0 0 7 8 | Z Z 0 1 9 0 | Z Z 1 1 1 2 |
|---|---|---|---|---|---|---|---|---|---|
| 1 | 0 | 1 | 11 11 11 11 11 11 11 11 11 11 11 11 | 11 | 11 | 11 | 11 | 11 | 11 |
| 2 | 0 | 1 | 01 11 11 11 11 11 11 11 11 11 11 11 | 00 | 00 | 00 | 00 | 00 | 00 |
| 3 | 0 | 1 | 10 11 11 11 11 11 11 11 11 11 11 11 | 00 | 00 | 00 | 00 | 00 | 00 |
| 4 | 0 | 1 | 11 01 11 11 11 11 11 11 11 11 11 11 | 00 | 00 | 00 | 00 | 00 | 00 |
| 5 | 0 | 1 | 11 10 11 11 11 11 11 11 11 11 11 11 | 00 | 00 | 00 | 00 | 00 | 00 |
| 6 | 0 | 1 | 11 11 01 11 11 11 11 11 11 11 11 11 | 00 | 00 | 00 | 00 | 00 | 00 |
| 7 | 0 | 1 | 11 11 10 11 11 11 11 11 11 11 11 11 | 00 | 00 | 00 | 00 | 00 | 00 |
| 8 | 0 | 1 | 11 11 11 01 11 11 11 11 11 11 11 11 | 00 | 00 | 00 | 00 | 00 | 00 |
| 9 | 0 | 1 | 11 11 11 10 11 11 11 11 11 11 11 11 | 00 | 00 | 00 | 00 | 00 | 00 |
| 10 | 0 | 1 | 11 11 11 11 01 11 11 11 11 11 11 11 | 00 | 00 | 00 | 00 | 00 | 00 |
| 11 | 0 | 1 | 11 11 11 11 10 11 11 11 11 11 11 11 | 00 | 00 | 00 | 00 | 00 | 00 |
| 12 | 0 | 1 | 11 11 11 11 11 01 11 11 11 11 11 11 | 00 | 00 | 00 | 00 | 00 | 00 |
| 13 | 0 | 1 | 11 11 11 11 11 10 11 11 11 11 11 11 | 00 | 00 | 00 | 00 | 00 | 00 |
| 14 | 0 | 1 | 11 11 11 11 11 11 01 11 11 11 11 11 | 00 | 00 | 00 | 00 | 00 | 00 |
| 15 | 0 | 1 | 11 11 11 11 11 11 10 11 11 11 11 11 | 00 | 00 | 00 | 00 | 00 | 00 |
| 16 | 0 | 1 | 11 11 11 11 11 11 11 01 11 11 11 11 | 00 | 00 | 00 | 00 | 00 | 00 |
| 17 | 0 | 1 | 11 11 11 11 11 11 11 10 11 11 11 11 | 00 | 00 | 00 | 00 | 00 | 00 |
| 18 | 0 | 1 | 11 11 11 11 11 11 11 11 01 11 11 11 | 00 | 00 | 00 | 00 | 00 | 00 |
| 19 | 0 | 1 | 11 11 11 11 11 11 11 11 10 11 11 11 | 00 | 00 | 00 | 00 | 00 | 00 |
| 20 | 0 | 1 | 11 11 11 11 11 11 11 11 11 01 11 11 | 00 | 00 | 00 | 00 | 00 | 00 |
| 21 | 0 | 1 | 11 11 11 11 11 11 11 11 11 10 11 11 | 00 | 00 | 00 | 00 | 00 | 00 |
| 22 | 0 | 1 | 11 11 11 11 11 11 11 11 11 11 01 11 | 00 | 00 | 00 | 00 | 00 | 00 |
| 23 | 0 | 1 | 11 11 11 11 11 11 11 11 11 11 10 11 | 00 | 00 | 00 | 00 | 00 | 00 |
| 24 | 1 | 0 | 00 00 00 00 00 00 00 00 00 00 00 00 | 11 | 11 | 11 | 11 | 11 | 11 |
| 25 | 1 | 0 | 10 00 00 00 00 00 00 00 00 00 00 00 | 00 | 00 | 00 | 00 | 00 | 00 |
| 26 | 1 | 0 | 01 00 00 00 00 00 00 00 00 00 00 00 | 00 | 00 | 00 | 00 | 00 | 00 |

TABLE 2-continued

| NUM | "0"=0.0V "1"=-1.2V TT | "0"=0.0V "1"=-0.5V TC | I01 | I02 | I03 | I04 | I05 | I06 | I07 | I08 | I09 | I10 | I11 | I12 | I13 | I14 | I15 | I16 | I17 | I18 | I19 | I20 | I21 | I22 | Z01 | Z02 | Z03 | Z04 | Z05 | Z06 | Z07 | Z08 | Z09 | Z10 | Z11 | Z12 |
|---|---|---|---|---|---|---|---|---|---|---|---|---|---|---|---|---|---|---|---|---|---|---|---|---|---|---|---|---|---|---|---|---|---|---|---|---|
| 27 | 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 28 | 1 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 29 | 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 30 | 1 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 31 | 1 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 32 | 1 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 33 | 1 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 34 | 1 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 35 | 1 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 36 | 1 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 37 | 1 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| 38 | 1 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 |
| 39 | 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 |
| 40 | 1 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 |
| 41 | 1 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 |
| 42 | 1 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |
| 43 | 1 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| 44 | 1 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 |
| 45 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| 46 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 |

TABLE 2A

| Test Number | "0"=0.0V "1"=-2.0V | | | | | | | | | | | | "0"=0.0V "1"=-1.2V | | "0"=0.0V "1"=-0.5V | |
|---|---|---|---|---|---|---|---|---|---|---|---|---|---|---|---|---|
| | T1 | T2 | T3 | T4 | T5 | T6 | T1 | T2 | T3 | T4 | T5 | T6 | TT | TC | INPUTS | OUTPUTS |
| 1–46 | 0 | 0 | 0 | 0 | 0 | 0 | 1 | 1 | 1 | 1 | 1 | 1 | | | | |
| 47–92 | 0 | 0 | 0 | 0 | 0 | 1 | 1 | 1 | 1 | 1 | 1 | 0 | | | | |
| 93–138 | 0 | 0 | 0 | 0 | 1 | 0 | 1 | 1 | 1 | 1 | 0 | 1 | | | | |
| 139–184 | 0 | 0 | 0 | 0 | 1 | 1 | 1 | 1 | 1 | 1 | 0 | 0 | | | | |
| 185–230 | 0 | 0 | 0 | 1 | 0 | 0 | 1 | 1 | 1 | 0 | 1 | 1 | T | T | T | T |
| 231–276 | 0 | 0 | 0 | 1 | 0 | 1 | 1 | 1 | 1 | 0 | 1 | 0 | E | E | E | E |
| 277–322 | 0 | 0 | 0 | 1 | 1 | 0 | 1 | 1 | 1 | 0 | 0 | 1 | S | S | S | S |
| 323–368 | 0 | 0 | 0 | 1 | 1 | 1 | 1 | 1 | 1 | 0 | 0 | 0 | T | T | T | T |
| 369–414 | 0 | 0 | 1 | 0 | 0 | 0 | 1 | 1 | 0 | 1 | 1 | 1 | | | | |
| 415–460 | 0 | 0 | 1 | 0 | 0 | 1 | 1 | 1 | 0 | 1 | 1 | 0 | A | A | A | A |
| 461–506 | 0 | 0 | 1 | 0 | 1 | 0 | 1 | 1 | 0 | 1 | 0 | 1 | L | L | L | L |
| 507–552 | 0 | 0 | 1 | 0 | 1 | 1 | 1 | 1 | 0 | 1 | 0 | 0 | L | L | L | L |
| 553–598 | 0 | 0 | 1 | 1 | 0 | 0 | 1 | 1 | 0 | 0 | 1 | 1 | | | | |
| 599–644 | 0 | 0 | 1 | 1 | 0 | 1 | 1 | 1 | 0 | 0 | 1 | 0 | C | C | C | C |
| 645–690 | 0 | 0 | 1 | 1 | 1 | 0 | 1 | 1 | 0 | 0 | 0 | 1 | A | A | A | A |
| 691–736 | 0 | 0 | 1 | 1 | 1 | 1 | 1 | 1 | 0 | 0 | 0 | 0 | S | S | S | S |
| 737–782 | 0 | 1 | 0 | 0 | 0 | 0 | 1 | 0 | 1 | 1 | 1 | 1 | E | E | E | E |
| 783–828 | 0 | 1 | 0 | 0 | 0 | 1 | 1 | 0 | 1 | 1 | 1 | 0 | S | S | S | S |
| 829–874 | 0 | 1 | 0 | 0 | 1 | 0 | 1 | 0 | 1 | 1 | 0 | 1 | | | | |
| 875–920 | 0 | 1 | 0 | 0 | 1 | 1 | 1 | 0 | 1 | 1 | 0 | 0 | | | | |
| 921–966 | 0 | 1 | 0 | 1 | 0 | 0 | 1 | 0 | 1 | 0 | 1 | 1 | | | | |
| 967–1012 | 0 | 1 | 0 | 1 | 0 | 1 | 1 | 0 | 1 | 0 | 1 | 0 | | | | |
| 1013–1058 | 0 | 1 | 0 | 1 | 1 | 0 | 1 | 0 | 1 | 0 | 0 | 1 | | | | |
| 1059–1104 | 0 | 1 | 0 | 1 | 1 | 1 | 1 | 0 | 1 | 0 | 0 | 0 | | | | |
| 1105–1150 | 0 | 1 | 1 | 0 | 0 | 0 | 1 | 0 | 0 | 1 | 1 | 1 | | | | |
| 1151–1196 | 0 | 1 | 1 | 0 | 0 | 1 | 1 | 0 | 0 | 1 | 1 | 0 | | | | |
| 1197–1242 | 0 | 1 | 1 | 0 | 1 | 0 | 1 | 0 | 0 | 1 | 0 | 1 | | | | |
| 1243–1288 | 0 | 1 | 1 | 0 | 1 | 1 | 1 | 0 | 0 | 1 | 0 | 0 | | | | |
| 1289–1334 | 0 | 1 | 1 | 1 | 0 | 0 | 1 | 0 | 0 | 0 | 1 | 1 | | | | |
| 1335–1380 | 0 | 1 | 1 | 1 | 0 | 1 | 1 | 0 | 0 | 0 | 1 | 0 | | | | |
| 1381–1426 | 0 | 1 | 1 | 1 | 1 | 0 | 1 | 0 | 0 | 0 | 0 | 1 | | | | |
| 1427–1472 | 0 | 1 | 1 | 1 | 1 | 1 | 1 | 0 | 0 | 0 | 0 | 0 | | | | |
| 1473–1518 | 1 | 0 | 0 | 0 | 0 | 0 | 0 | 1 | 1 | 1 | 1 | 1 | | | | |
| 1519–1564 | 1 | 0 | 0 | 0 | 0 | 1 | 0 | 1 | 1 | 1 | 1 | 0 | | | | |
| 1565–1610 | 1 | 0 | 0 | 0 | 1 | 0 | 0 | 1 | 1 | 1 | 0 | 1 | | | | |
| 1611–1656 | 1 | 0 | 0 | 0 | 1 | 1 | 0 | 1 | 1 | 1 | 0 | 0 | | | | |
| 1657–1702 | 1 | 0 | 0 | 1 | 0 | 0 | 0 | 1 | 1 | 0 | 1 | 1 | | | | |
| 1703–1748 | 1 | 0 | 0 | 1 | 0 | 1 | 0 | 1 | 1 | 0 | 1 | 0 | | | | |
| 1749–1794 | 1 | 0 | 0 | 1 | 1 | 0 | 0 | 1 | 1 | 0 | 0 | 1 | | | | |
| 1795–1840 | 1 | 0 | 0 | 1 | 1 | 1 | 0 | 1 | 1 | 0 | 0 | 0 | | | | |

What is claimed is:

1. A programmable circuit array having a plurality of input terminals, each input terminal adapted to receive one of a plurality of input signals, comprising:

(a) input buffer means, having a plurality of output terminals and inverted output terminals, said input buffer means operatively connected to said input terminals, for outputting equivalent input signals and inverted input signals on respective output terminals and inverted output terminals;

(b) programmable product array means, having a plurality of output terminals, operatively connected to said output terminals of said input buffer means thereby receiving said equivalent input signals and said inverted input signals, for generating a plurality of product terms, wherein each output terminal of said programmable product array means transmits one of said product terms;

(c) programmable sum array means for combining said plurality of product terms to generate a plurality of sum terms, each of said plurality of sum terms being an output of said programmable circuit array; and (d) test means for selectively causing each of said product terms, said equivalent input signals, and said inverted input signals to have a predetermined logic state in response to at least one control signal.

2. A programmable circuit array according to claim 1 wherein said programmable product means comprises: a plurality of AND gates, each AND gate having a plurality of input terminals for receiving at least one equivalent input signal, or at least one inverted input signal, each input terminal of each of said plurality of AND gates having associated therewith a fusible link, the output terminal of each AND gate yielding a product term.

3. A programmable circuit aray, according to claim 1, wherein said test means, having a first and second control input terminal adapted to receive a first and second control signal, and further having a plurality of select control input terminals adapted to receive a plurality of select control input signals, comprises:

(a) a plurality of first circuit component means, each of said first circuit component means operatively connected to a respective output terminal and inverted output terminal of said input buffer means, and further, each of said first circuit component means which is operatively connected to a respective output terminal of said input buffer means being operatively connected to said first conrol input terminal, and each of said first circuit component means which is operatively connected to a respective inverted output terminal of said input buffer means being operatively connected to said second conrol input terminal, for causing each of said output terminals and each of said inverted output terminals of said input buffer means to be forced to a first predetermined logic level in response to said first and second control signals, respectively; and (b) a plurality of circuit selector means, each circuit selector means being operatively connected to one of said output terminals of said programmable product array means, and further, each circuit selector means being operatively connected to selected ones of said plurality of select control input terminals, for selectively causing a preselected number of product terms to be at a predetermined logic level in response to said select control input signals.

4. A programmable circuit array according to claim 3 wherein said programmable product means comprises: a plurality of AND gates, each AND gate having a plurality of input terminals for receiving the respective equivalent input signal and respective inverted input signal, each input terminal of each of said plurality of AND gates having associated therewith a fusible link, the output terminal of each AND gate yielding a product term.

5. A programmable circuit array according to claims 1, 4, 2, or 3, wherein said programmable sum array means comprises: a plurality of OR gates, each OR gate having a plurality of input terminals for receiving the respective product term, and each input terminal of said plurality of OR gates having associated therewith a fusible link, the output of each OR gate being the outputs of said programmable circuit array.

6. A programmable circuit array according to claim 5 further comprising:
programmable selective logic means, operatively connected to said programmable sum array means to receive said plurality of sum terms, for outputting each of the plurality of sum terms in a normal state or in an inverted state.

7. A programmable circuit array according to claim 11 wherein said programmable selective logic means comprises:
a plurality of exclusive OR circuits wherein a first input of each of said exclusive OR circuits is coupled to the programmable sum array means to receive the respective sum term and a second input of each of said exclusive OR circuit having a fusible link coupled to a predetermined logic level.

* * * * *